(12) United States Patent
Liu et al.

(10) Patent No.: US 10,996,856 B2
(45) Date of Patent: May 4, 2021

(54) HARDWARE-SUPPORTED 3D-STACKED NVM DATA COMPRESSION METHOD AND SYSTEM THEREOF

(71) Applicant: Huazhong University of Science and Technology, Hubei (CN)

(72) Inventors: Haikun Liu, Hubei (CN); Xiaofei Liao, Hubei (CN); Hai Jin, Hubei (CN); Yuanyuan Ye, Hubei (CN)

(73) Assignee: HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 0 days.

(21) Appl. No.: 16/750,655

(22) Filed: Jan. 23, 2020

(65) Prior Publication Data

US 2020/0278795 A1 Sep. 3, 2020

(30) Foreign Application Priority Data

Feb. 28, 2019 (CN) .......................... 201910153736.5

(51) Int. Cl.
| | | |
|---|---|---|
| G03F 3/06 | (2006.01) | |
| G06F 3/06 | (2006.01) | |
| G11C 7/10 | (2006.01) | |
| H01L 25/065 | (2006.01) | |

(52) U.S. Cl.
CPC .......... *G06F 3/0608* (2013.01); *G06F 3/0661* (2013.01); *G06F 3/0688* (2013.01); *G11C 7/10* (2013.01); *H01L 25/0657* (2013.01)

(58) Field of Classification Search
CPC .... G06F 3/0608; G06F 3/0661; G06F 3/0688; G06F 3/0611; G06F 3/0625; G06F 3/0638; G06F 3/0679; G06F 3/0616; G11C 7/10; G11C 7/1006; H01L 25/0657
See application file for complete search history.

(56) References Cited

U.S. PATENT DOCUMENTS

| | | | | |
|---|---|---|---|---|
| 8,787,563 | B2 * | 7/2014 | Shirai | H04L 9/0637 380/28 |
| 10,037,245 | B2 * | 7/2018 | Gerhard | G06F 3/065 |
| 10,437,667 | B2 * | 10/2019 | Gerhard | G06F 3/0688 |
| 2011/0211688 | A1 * | 9/2011 | Shirai | H04L 9/0637 380/28 |
| 2018/0285014 | A1 * | 10/2018 | Li | G06F 12/00 |

* cited by examiner

*Primary Examiner* — Fernando Hidalgo
(74) *Attorney, Agent, or Firm* — Michael X. Ye; Morris, Manning & Martin, LLP

(57) ABSTRACT

The present disclosure involves a hardware-supported 3D-stacked NVM data compression method and system, involving setting a first identifier to mark a compression state of written-back data, the method at least comprising steps of: dividing the written-back data into a plurality of sub-blocks and acquiring a plurality of first output results through OR operations among the sub-blocks, respectively, or acquiring a plurality of second output results through exclusive OR operations among the sub-blocks, and determining a compression strategy for the written-back data based on the first output results or the second output results; and setting a second identifier to mark a storing means of the written-back data so that the second identifier is in pair with the first identifier, and configuring a storage strategy for the written-back data that includes at least rotating the second identifier.

7 Claims, 7 Drawing Sheets

HARDWARE-SUPPORTED 3D-STACKED NVM DATA COMPRESSION METHOD AND SYSTEM THEREOF

FIELD

The present invention relates to data processing, and more particularly to a hardware-supported 3D-stacked NVM data compression method and a system using the method.

DESCRIPTION OF RELATED ART

In the era of big data, the huge amount of data generated rapidly requires computers to have larger memory, larger bandwidth and low throughput latency than ever. The traditional dynamic random access memory (DRAM) has become incompetent when facing the increasingly demanding requirements for memory. Some emerging types of none-volatile memory (NVM), such as phase change memory (PCM), spin transfer torque magnetoresistive random access memory (STT-MRAM), and magnetic random access memory (MRAM), are byte addressable, and comparable to DRAM in terms of reading and writing speed, and have advantages such as no standby power consumption, large density (more data can be stored in a unit volume), and high scalability. However, while NVM is a good alternative to DRAM as a main memory medium, it has many shortcomings, including: (1) high writing power consumption; (2) much reading and writing latency, meaning one order of magnitude slower than PCM in reading and two in writing; (3) short service life, making them imperfect for main memory of computers. A presently popular approach is to mixing a large number of NVM units with a small number of DRAM units into a heterogeneous memory structure, so as to have both the large capacity of NVM and low access latency, low writing power consumption, long service life and the advantages of DRAM, thereby improving memory systems in terms of performance, power consumption and service life.

Therefore, there have been many solutions developed in the academia and in the industry with the attempt to address the defects of NVM related to high writing power consumption, high writing latency, and limited service life. As one example, multiple memory chips are organized in some way to form a 3D-stacked memory structure, so as to enjoy both high capacity and high bandwidth. Through silicon via may be used to achieve such a 3D-stacked structure. This technology allows multiple silicon wafers or chips to be vertically interconnected and effectively stacked, so as to enlarge memory, improve bandwidth, reduce latency, and enhance throughput. Another example is a data-centered system based on the foregoing 3D-stacked memory structure. In such a system, the CPU is as close as possible to the memory, so as to minimize data transmission distance and in turn transmission latency, such as near-data processing (NDP) and processing in memory (PIM). Thus, it has been a dominant topic in both the academia and the industry to build 3D-stacked memory using TSV and to combine the concept of NDP and PIM to integrate CPU with memory chips. In the HBM (high bandwidth memory) supported by Hynix and AMD, memory is located as close to CPU or GPU as possible. This is achieved by stacking memory chips in one matrix and then combining the processors and the memory stack to form a building block, which is then installed onto the motherboard of the server. In the HMC (hybrid memory cube) technology supported by Intel and led by Micron, storage chips stacked onto a vertical device to allow access to serial memory in 3-D arrays. These arrays have an additional logic layer for memory management, and this device can be installed neat every processor by server manufacturers. Besides, as taught by researches, considerable redundancy exists in memory data, so memory compression methods have been introduced in the academia and the industry with the attempt to reduce data volume, thereby lowering reading and writing latency, decreasing reading and writing power consumption, and enlarging available memory capacity. For example, China Patent Publication No.CN105262491A discloses a data compression method and a system thereof, a data decompression method and a system thereof, and a communication device. The method comprises: presetting a rule about whether user devices have to compress data they generates; upon acquirement of the data generated by one of the user devices, determining whether the acquired data have to be compressed according to the rule; where the acquired data need not to be compressed, identifying the acquired data as uncompressed data using a first identifier; where the acquired data need to be compressed, compressing the acquired data; and identifying the data after compression as compressed data using a second identifier. In the prior-art method, acquired data are selectively compressed so as to eliminate the workload of communication devices caused by unnecessary compression.

However, since compression and decompression for memory data always require costs and decompression is perfumed along the path of memory access, a trade-off about memory compression is raised. On one hand, good compression algorithms are unavoidably complex and difficult to realize, leading to adverse impacts on memory latency and system performance. On the other hand, compression algorithms with low compression rate are usually ineffective in improving NVM defects. Hence, the present invention provides a data compression method that enhances writing speed and reduces writing power consumption.

SUMMARY OF THE INVENTION

The term "module" as used herein describes any type of hardware, software, or combination of software and hardware that is capable of performing the functions associated with "module."

In view of the shortcomings of the prior art, the present disclosure discloses a hardware-supported 3D-stacked NVM data compression method, involving setting a first identifier to mark a compression state of written-back data, the method at least comprising steps of: dividing the written-back data into a plurality of sub-blocks and acquiring a plurality of first output results through OR operations among the sub-blocks, respectively, or acquiring a plurality of second output results through exclusive OR operations among the sub-blocks, and determining a compression strategy for the written-back data based on the first output results or the second output results. Setting a second identifier to mark a storing means of the written-back data so that the second identifier is in pair with the first identifier, and configuring a storage strategy for the written-back data that includes at least rotating the second identifier. The value of the second identifier is obtained by mapping the old value. The existing wear-leveling technologies are based on page remapping with page granularity and involve page tables, while needing the participation of operating systems. Nevertheless, in the present invention, rotation can be realized simply in a hardware-based manner using a negation logic rather than participation of operating systems.

According to one mode, the step of determining the compression strategy at least comprising steps of: dividing the written-back data into $n_1$ sub-blocks, wherein for each said sub-block entering one said first output result expressed in either "0" or "1" that is one of $n_1$ results obtained by performing the OR operation in an $h_1$-bit first comparator respectively, and where a number $N_1$ of the first output results expressed in "0" is greater than 1, compressing the written-back data by performing a first compression process, in which where $N_1$ is smaller than or equal to 1, re-dividing the written-back data into $n_2$ sub-blocks, for each said sub-block entering one said first output result expressed in either "0" or "1" that is one of $n_2$ results obtained by performing the OR operation in an $h_2$-bit second comparator, respectively, and where a number $N_2$ of the first output results expressed in "0" is greater than 2 and the last p first output results are not all being "1", compressing the written-back data by performing a second compression process. The first compression process and the second compression process are proposed by making use of the fact that there are many zero blocks in memory data and are based on cacheline (i.e. 64B) granularity, so can be realized using a simple and efficient logic, and the costs are low. On the contrary, the existing technologies are most based on page granularity and realized using a complicated logic with higher costs.

According to one mode, the step of determining the compression strategy further comprises: where $N_2$ is smaller than or equal to 2, or the p first output results are all being "1", re-dividing the written-back data into $n_3$ sub-blocks, performing exclusive OR operations in the first sub-block and between the first sub-block and the other sub-blocks, respectively, so as to acquire $n_3$ said second output results, and where the second output results are all being 1B, compressing the written-back data by performing a third compression process.

According to one mode, the step of determining the storage strategy at least comprises steps of: configuring a memory space for the written-back data that at least comprises an identifier storage area, a compressed data storage area and an idle area according to a size of the written-back data, and dividing the memory space into sub-spaces each sized 1B. Where a value of the second identifier is expressed in 0 or 1, rotating the second identifier by exchanging the value of the second identifier, wherein where the value of the second identifier is 0, the identifier storage area is defined by the first b sub-spaces jointly, and where the value of the second identifier is 1, the identifier storage area is defined by the last b sub-spaces jointly.

According to one mode, the first compression process at least comprises steps of: updating the first identifier to indicate that the written-back data have been compressed, reading and rotating the second identifier, where the value of the second identifier after said rotation is 0, compressing and storing the data according to a first storing means, and where the value of a second identifier after said rotation is 1, compressing and storing the data according to the second storing means, wherein the first storing means refers to that the first sub-space, the second sub-space, the third sub-space and the fourth sub-space jointly form the identifier storage area, wherein the first sub-space and the second sub-space are configured to have the $n_1$ first output results written thereinto, and the third sub-space and the fourth sub-space are configured to have "1" written thereinto, and that $M_1$ said sub-blocks whose output results are "1" are written into the fifth sub-space, the sixth sub-space ... through the $4*(M_1+1)^{th}$ sub-space of the memory space successively. The second storing means refers to that the last four sub-spaces form the identifier storage area jointly, that the first two sub-spaces of the identifier storage area are configured to have the $n_1$ first output results written thereinto, that the last two sub-spaces of the identifier storage area are configured to have "1" written thereinto, and that $M_1$ said sub-blocks whose output results are "1" are written into the $[4*(N_1-1)+1]^{th}$ sub-space through the $(a-4)^{th}$ sub-space of the memory space.

According to one mode, the second compression process at least comprising steps of: updating the first identifier to indicate that the written-back data have been compressed, and reading and rotating the second identifier, which involves where a value of the second identifier after said rotation is 0, compressing and storing the data according to a third storing means, and where a value of the second identifier after said rotation is 1, compressing and storing the data according to a fourth storing means, wherein the third storing means refers to that the first sub-space, the second sub-space, the third sub-space and the fourth sub-space form the identifier storage area jointly, in which the first sub-space, the second sub-space, the third sub-space and the fourth sub-space are configured to having the $n_2$ first output results written thereinto, and that $M_2$ said sub-blocks whose output results are "1" are written into the fifth sub-space through the $[2*(M_2+2)]^{th}$ sub-space of the memory space successively. The fourth storing means refers to that the last four sub-spaces form the identifier storage area jointly, that the last four sub-spaces are configured to have the $n_2$ first output result written thereinto successively, and that $M_2$ sub-blocks whose output results are "1" are written into the $[2*(N_2-2)+1]^{th}$ sub-space through the $(a-4)^{th}$ sub-space of the memory space successively.

According to one mode, the third compression process at least comprising steps of: updating the first identifier to indicate that the written-back data have been compressed, and reading and rotating the second identifier, which involves where a value of the second identifier after said rotation is 0, compressing and storing the data according to a fifth storing means, and where a value of the second identifier after said rotation is 1, compressing and storing the data according to a sixth storing means, wherein the fifth storing means refers to that the first sub-space, the second sub-space, the third sub-space and the fourth sub-space form the identifier storage area jointly, in which the first sub-space, the second sub-space, the third sub-space and the fourth sub-space all have "1" written thereinto, that the first sub-blocks are written into the fifth sub space through the $8^{th}$ sub-space successively, and that the $n_3$ second output results are written into the $9^{th}$ sub-space through the $24^{th}$ sub-space successively. The sixth storing means refers to that the last four sub-spaces of the memory space form the encoding identifier area jointly, in which all the spaces of the identifier storage area have "1" written thereinto, that the first sub-blocks are written into the $41^{st}$ sub-space through the $44^{th}$ sub-space successively, and that the $n_3$ second output results are written into the $45^{th}$ sub-space through the $60^{th}$ sub-space successively.

The present disclosure also discloses a hardware-supported 3D-stacked NVM data compression system, at least comprising a central processing unit and a 3D-stacked NVM, the 3D-stacked NNM being configured to compress written-back data of the central processing unit according to steps of: dividing the written-back data into a plurality of sub-blocks and acquiring a plurality of first output results through OR operations among the sub-blocks, respectively, or acquiring a plurality of second output results through exclusive OR operations among the sub-blocks, and determining a compression strategy for the written-back data based on the first output results or the second output results. Setting a second identifier to mark a storing means of the written-back data so that the second identifier is in pair with the first identifier, and configuring a storage strategy for the written-back data that includes at least rotating the second identifier.

According to one mode, the 3D-stacked NVM at least comprises a data compression module for compressing the written-back data, an addressing module for rotation and a data decompression module for decompressing data, the data compression module is configured to divide the written-back data into $n_1$ sub-blocks, wherein for each said sub-block enter one said first output result expressed in either "0" or "1" that is one of $n_1$ results obtained by performing the OR operation in an $h_1$-bit first comparator, respectively, and where a number $N_1$ of the first output results expressed in "0" is greater than 1, compress the written-back data by performing a first compression process, in which where $N_1$ is smaller than or equal to 1, re-divide the written-back data into $n_2$ sub-blocks, for each said sub-block enter one said first output result expressed in either "0" or "1" that is one of $n_2$ results obtained by performing the OR operation in an $h_2$-bit second comparator, respectively, and where a number $N_2$ of the first output results expressed in "0" is greater than 2 and the last p first output results are not all being "1", compress the written-back data by performing a second compression process.

According to one mode, the data decompression module at least comprises a first decompression unit, a second decompression unit and a third decompression unit, in which the data decompression module decompresses the data by: reading the first identifier, where a value of the first identifier is 0, reading the data directly, and where the value of the first identifier is 1, reading the second identifier, and extracting identification sites from the identifier storage area; where a value of the second identifier is 0 and all the identification site data are "1", decompressing the data using the third decompression unit, which involves where none of the identification site data is "1" and the last two bit data are both "1", decompressing the remaining part of the identification site data using the first decompression unit; or, where none of the last two identification sites is "1", decompressing the data using the second decompression unit; and where the value of the second identifier is 1 and all the identification site data are "1", decompressing the data using the third decompression unit, which involves where none of the identification site data is "1" and all of the last two bits are "1", decompressing the remaining part of the identification site data using the first decompression unit; or, where none of the last two bits is "1", decompressing the data using the second decompression unit.

The present disclosure has the following technical benefits:

The disclosed system employs a simple and efficient data compression algorithm, which helps to reduce data volume, thereby enhancing writing speed and lowering writing power consumption.

The disclosed system saves hardware costs by placing algorithmic identifier in the space saved using compression instead in a dedicated memory device.

The disclosed system implements a method based on identifier rotation, thereby realizing efficient memory data placement strategy wherein the post-compression surplus space is used for wear-leveling, thereby improving the service life of NWM.

DETAILED DESCRIPTION OF THE INVENTION

The invention as well as a preferred mode of use, further objectives and advantages thereof will be best understood by reference to the following detailed description of illustrative embodiments when read in conjunction with the accompanying drawings.

Embodiment 1

The present invention provides a hardware-supported 3D-stacked NVM data compression system, which is made by combining DRAM and NVM that enables 3D-stacked data compression into a high-capacity heterogeneous memory system. The system has a logic processing unit in the logic layer of the 3D-stacked NVM dedicated for data compression, and in virtue of data compression, the system reduces the data volume to be written into the NVM, thereby speeding up writing and lowering writing power consumption. Further, the system adopts a memory data placement strategy, which efficiently manages the compressed data in the memory, so as to well use the available space after data compression for the purpose of wear-leveling, thereby improving the NVM in terms of service life.

Figure 1:
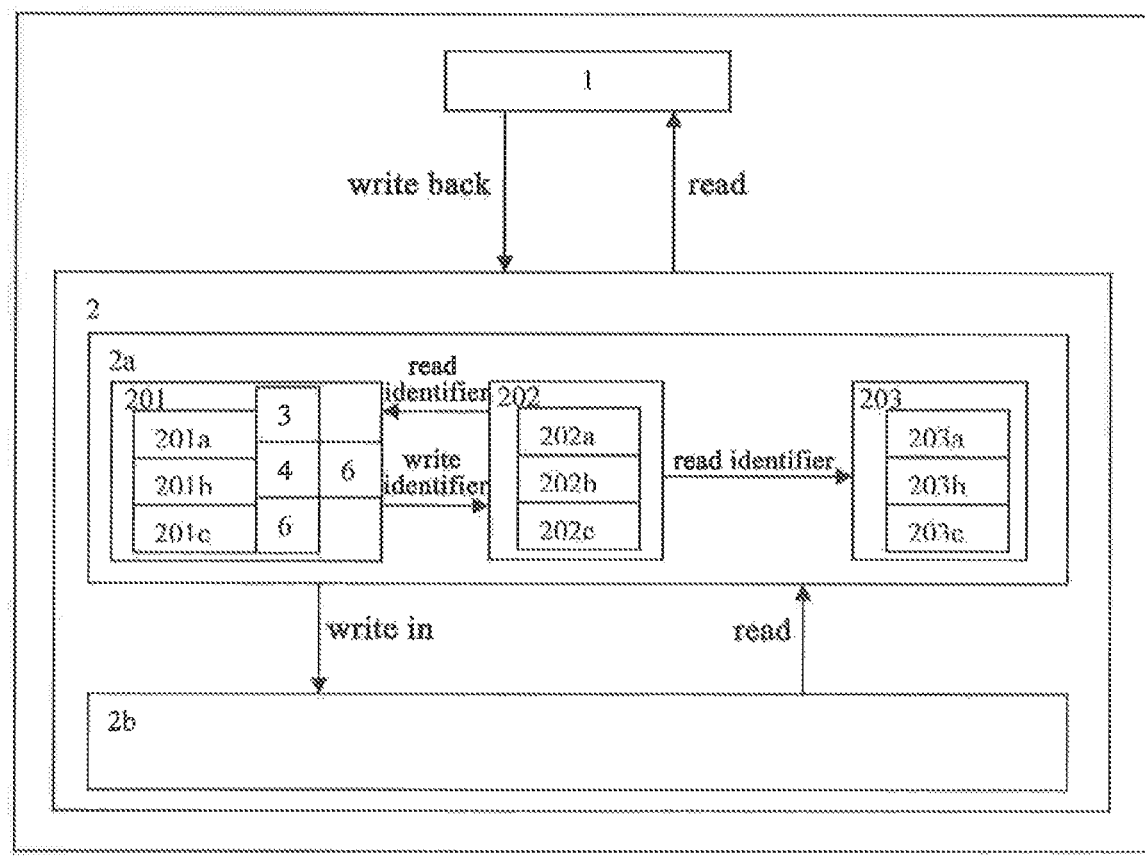
FIG. 1 is a modular structure diagram of a preferred 3D stacked NVM data compression system of the present invention.

Particularly, FIG. 1 is a modular structure diagram of a preferred 3D-stacked NVM data compression system of the present invention. The 3D-stacked NVM data compression system at least comprises a central processing unit 1 and a 3D-stacked NVM storage unit 2. The central processing unit 1 and the 3D-stacked NVM storage unit 2 are communicated with each other, so that the 3D-stacked NVM storage unit 2 can read written-back data from the cache of the central processing unit 1, and the central processing unit 1 can read data from the 3D-stacked NVM storage unit 2. Preferably, the 3D-stacked NVM storage unit 2 at least comprises a data processing unit 2a and an NVM storage unit 2b. The data processing unit 2a serves to perform at least compression and decompression to the data written in by the 3D-stacked NVM storage unit 2. For example, when the data are written back to the 3D-stacked NVM 2 from the cache of the central processing unit 1, the written-back data first enter the logic layer of the 3D-stacked NVM, and the data processing unit 2a compresses the written-back data. The compressed data are then written and stored in the NVM storage unit 2b.

When the central processing unit 1 needs to read the data in the 3D-stacked NVM, the data processing unit 2a first read the data from the NVM storage unit 2b and decompresses the data. The decompressed data are then read by the central processing unit 1.

Preferably, referring to FIG. 1 again, the data processing unit 2a at least comprises a data compression module 201, an addressing module 202 and a data decompression module 203. The data compression module 201 serves to compress data in the memory while the data are written into the memory. The data decompression module 203 serves to decompress data when the memory is accessed. The addressing module 202 has a first identifier 202a, a second identifier 202b and a rotation unit 202c. The first identifier 202a serves to mark whether the memory data are compressed. The second identifier 202b serves to mark the storing means for the compressed memory data. The rotation unit 202c serves to perform rotation on the second identifier 202b so as to change the storage sites in the memory, thereby achieving wear-leveling. Preferably, by rotating the second identifier, the writing operations can be evenly distributed to the corresponding storage sites. The foregoing rotation is such performed by: when data are written in, if the current second identifier is "0", reversing it into "1"; and if the current second identifier is "1", reversing it into "0". The foregoing reverse can be achieved by resetting and placing bit sites. Preferably, the first identifier and the second identifier in the addressing module 202 come in pair, and both have a size of 1 bit site. They serve to make whether the written-back data have been compressed and the initial site of data storage. For example, for a page having a size of 4 KB and includes 6 data each having a size of 64 B, each page corresponds to an addressing module having a size of 128 bit sites, and the data of the 128 bit sites can be stored in independent storage hardware.

Figures 6, 7:
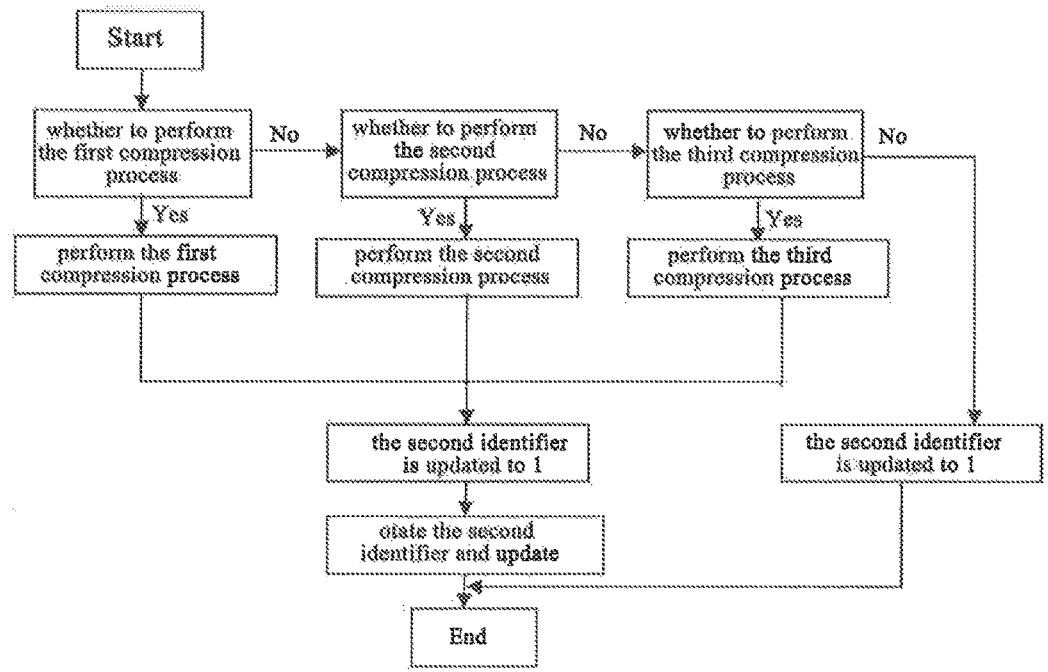
FIG. 6 shows an example of identification site data according to the present invention.
FIG. 7 is a flowchart of a preferred data compression process according to the present invention.

Preferably, as shown in FIG. 7, the data compression module 201 at least comprises a first compression unit 201a, a second compression unit 201b and a third compression unit 201c. The data processing unit 2a performs data compression through the following steps.

In Step S1, it is first to determine whether the data written back to the cache of the central processing unit 1 can be compressed using the first compression unit 201a. If the data can be compressed using the first compression unit 201a, the first compression unit 201a is used to compress the data. At the same time, the first identifier 202a is updated to indicate that the data are compressed. Then the second identifier is rotated, thereby ending the data compression process. For example, the first identifier and the second identifier may be marked using the computer-recognizable binary codes "0" and "1". When the data have been compressed using the first compression unit, the first identifier is updated to "1" from the initial value "0" so as to indicate that the data compression process has been completed. In other words, when the first identifier is "0", it means that the data are not compressed and when the first identifier is "1", it means that the data compression process has been completed. This provides the possibility to determine the compression state of data using the first identifier. Rotation of the second identifier refers to exchanging the values of the second identifier. For example, during the compression process for the written back data, the initial value of the second identifier is first read. When the initial value is "0", the second identifier is rotated by updating the value of the second identifier to "1". Alternatively, when the initial value of the second identifier is "1", the second identifier is rotated by updating the value of the second identifier to "0".

In Step S2, if the data cannot be compressed using the first compression unit 201a, it is to be determined whether the data can be compressed using the second compression unit 201b. If the data can be compressed using the second compression unit, the second compression unit is used to compress the data. At the same time, the first identifier is updated to indicate that the data are compressed, and the second identifier is rotated, thereby ending the data compression process.

In Step S3, if the data cannot be compressed using the second compression unit 201b, it is to be determined whether the data can be compressed using the third compression unit 201c. If the data can be compressed using the third compression unit compression, the third compression unit is used to compress the data. At the same time, the first identifier is updated to indicate that the data are compressed, and the second identifier is rotated, thereby ending the data compression process.

In Step S4: if the data cannot be compressed using the third compression unit 201c, the data are not to be compressed, and the original data as written in are written in to the NVM storage unit 2b directly. At the same time, the first identifier is updated to indicate that the data are not compressed, thereby ending the data compression process.

Embodiment 2

The present embodiment provides further improvements to Embodiment 1, and what is identical to its counterpart in the previous embodiment will not be repeated in the following description.

Preferably, the present invention further provides a 3D-stacked NVM data compression method. The method comprises dividing the written-back data into a plurality of sub-blocks and acquiring a plurality of first output results through OR operations among the sub-blocks, respectively, or acquiring a plurality of second output results through exclusive OR operations among the sub-blocks, and determining a compression strategy for the written-back data based on the first output results or the second output results; and setting a second identifier to mark a storing means of the written-back data so that the second identifier is in pair with the first identifier, and configuring a storage strategy for the written-back data that includes at least rotating the second identifier. Particularly, the 3D-stacked NVM data compression method at least comprises the following steps.

In Step S1, written-back data entered by the central processing unit 1 and having a size of m are transmitted to the first compression unit 201a. The first compression unit 201a evenly dividing the written-back data into n1 sub-blocks. Each of the sub-blocks is entered into an h1-bit first comparator 3 so as to obtain n1 output results, and the n1 output results are entered to the first register 5 for storage.

Figure 3:
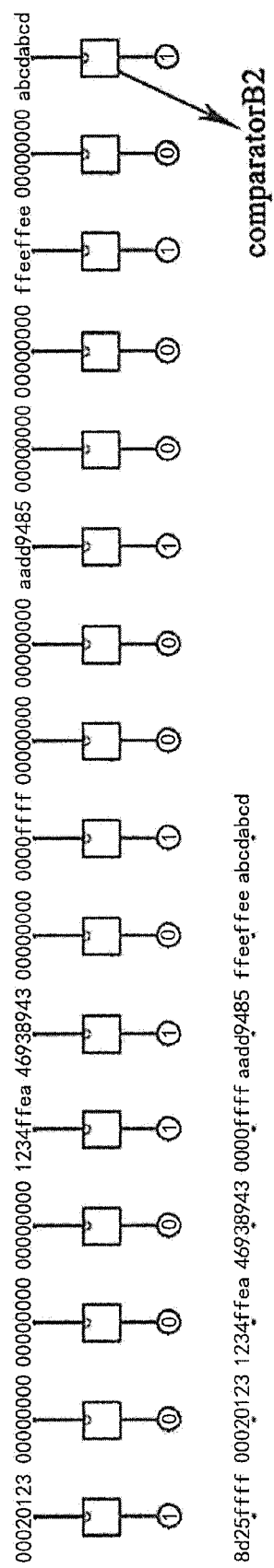
FIG. 3 is a structure diagram of a preferred first compression unit of the system according to the present invention.

Particularly, as shown in FIG. 3, the first compression unit 201a at least comprises 16 first comparators 3. The first comparator 3 is a 32-bit comparator, and accommodates 64 bits so as to enable 32-bit comparison. Therein, the first comparator 3 is composed of 31 "OR gates". Preferably, the written-back data entered by the central processing unit 1 may have a size of 64 B. According to an existing computer system, the data written back by the cache have a fixed size, which is always 64B. The first compression unit 201a evenly divides the 64B written-back data into 16 sub-blocks. Each of the sub-blocks has a size of 4 B. When all of the 4B sub-blocks have a size of "0", the output of the first comparator 3 is "0". Otherwise, the output of the first comparator 3 is "1". Through the 16 first comparators 3, 16 output results as "0" or "1" can be obtained. Each of the output results has a size of 1 bit, so the size of the first register 5 is 2B and can store 16 output results.

In Step S2, the numbers N1 and M1 of "0" and "1" in the first register 5 are determined, respectively. Where N1 is greater than 1, it is to be determined that the written-back data can be compressed using the first compression unit 201a and the first compression process is performed on the written-back data.

Figure 2:
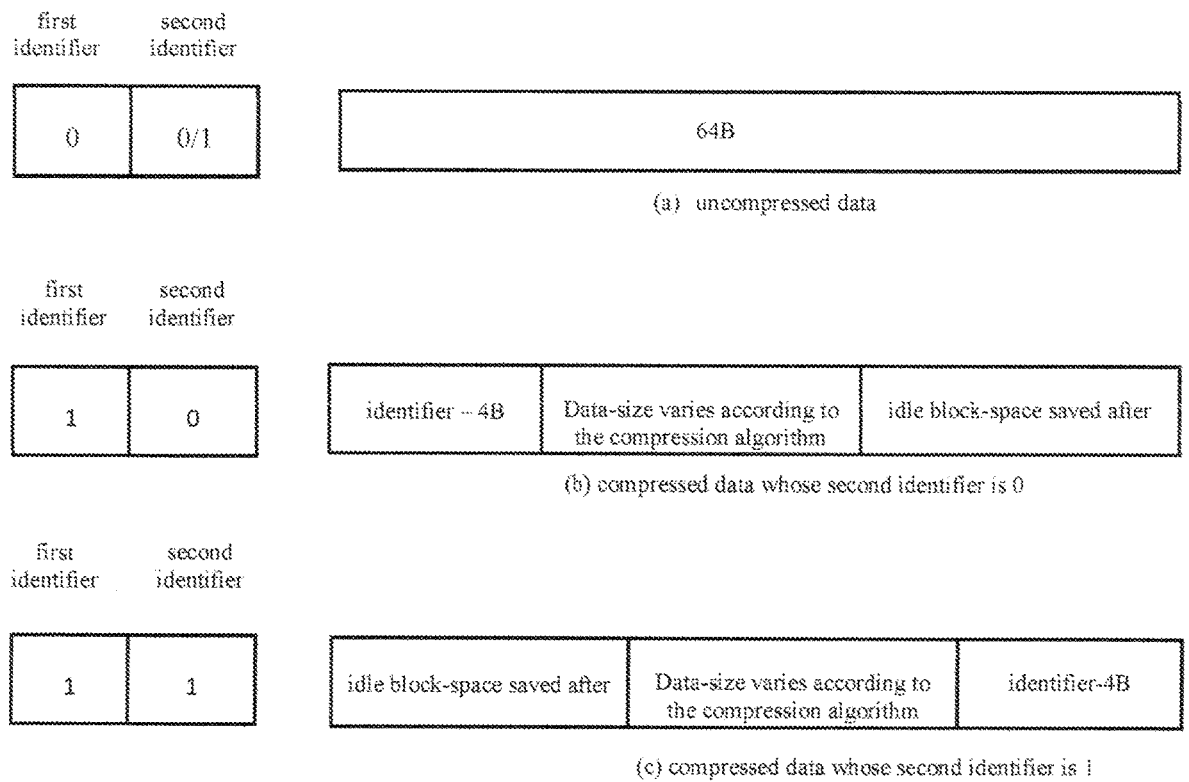
FIG. 2 is a diagram illustrating a preferred storing means for memory data according to the present invention.

Particularly, as shown in FIG. 2, the NVM storage unit 2b assigns memory spaces of the same sizes as that of the written data, respectively. For example, when the written data has a size of m, the memory space also has a size of m. The memory space may be composed of an identifier storage area, a compressed data storage area and an idle area. The size of the identifier storage area may be determined according to the value of n. For example, the size of the encoding identifier area is such configured that it can completely store n output results. Preferably, the identifier storage area has a size of 4B. Preferably, the memory space may be evenly divided in to "a" sub-spaces, namely the first, the second . . . through the ath sub-space, each having a size of 1B. Preferably, where the value of the second identifier is 0, the identifier storage area is defined by the first b sub-spaces jointly. Where the value of the second identifier is 1, the identifier storage area is defined by the last b sub-spaces jointly. Therein, b is preferably 4. For example, where the memory space has a size of 64B, the memory space may be divided into 64 sub-spaces, each having a size of 1B. FIG. 2a shows a storing means to storing source data or uncompressed data whose size is 64B. FIG. 2b shows a storing means to compressed data whose second identifier is 0. The first 4B are identification sites, followed by the compressed data, and the last is the idle space after data compression. FIG. 2c shows a storing means for compression data whose second identifier is 1. The last 4B are identification sites, immediately led by compressed data, and the font is the idle space after data compression.

Preferably, the first compression process at least comprises the following steps: updating the first identifier of the addressing module 202 so as to indicate that the written-back data have been compressed, reading and rotating the second identifier, determining a data storing means according to the rotated second identifier, and where a value of the second identifier after said rotation is 0, compressing and storing the data according to first storing means, and where a value of the second identifier after said rotation is 1, compressing and storing the data according to second storing means.

Preferably, the first storing means refers to that a first sub-space, a second sub-space, a third sub-space and a fourth sub-space form the identifier storage area jointly. Therein, the first sub-space and the second sub-space are configured to have all the n1 output results output by the first comparator 3 written thereinto, and the third sub-space and the fourth sub-space are configured to have output results of the first sub-space and the second sub-space having the value of 1 written thereinto. The M1 sub-blocks have the value of 1 in the first register 3 are written into the fifth sub-space, the sixth sub-space . . . through the [4*(M1+1)]th sub-space of the memory space successively. For example, as shown in FIG. 3, 16 32-bit comparators output 7 "1s" and 9 "0s". The 3B memory space and the 4B memory space can store 2*8=16 output results in total. The 7 "1s" are all stored in the 3B memory space first. The remaining spaces in the 3B memory space and in the 4B memory space are filled with "1". Since the 3B memory space and the 4B memory space are for data alignment and for identification, they are both filled with "1".

Preferably, the second storing means refers to that the last four sub-spaces of the memory space form the encoding identifier area jointly. In other words, the (a-3)th sub-space, the (a-2)th sub-space, the (a-1)th sub-space and the ath sub-space form the identifier storage area jointly. The (a-3)th sub-space and the (a-2)th sub-space are configured to have all the n1 output results output by the first comparator 3 written therein. The (a-1)th sub-space and the ath sub-space are configured to have the output results having the value of 1 in the (a-3)th sub-space and in the (a-2)th sub-space written thereinto. The M1 sub-blocks having the value of 1 in the first register 3 are written into the [4*(N1−1)+1]th sub-space . . . through the (a-4)th sub-space of the memory space successively.

In Step S3, where N1 is smaller than or equal to 1, the written-back data having the size of m entered by the central processing unit 1 are transmitted to the second compression unit 201b. The second compression unit 201b evenly divides the written-back data into n2 sub-blocks. Each of the sub-blocks is entered into an h2-bit second comparator 4 so as to obtain n2 output results. Then the n2 output results are all entered into the second register 6 for storage.

Figure 4:
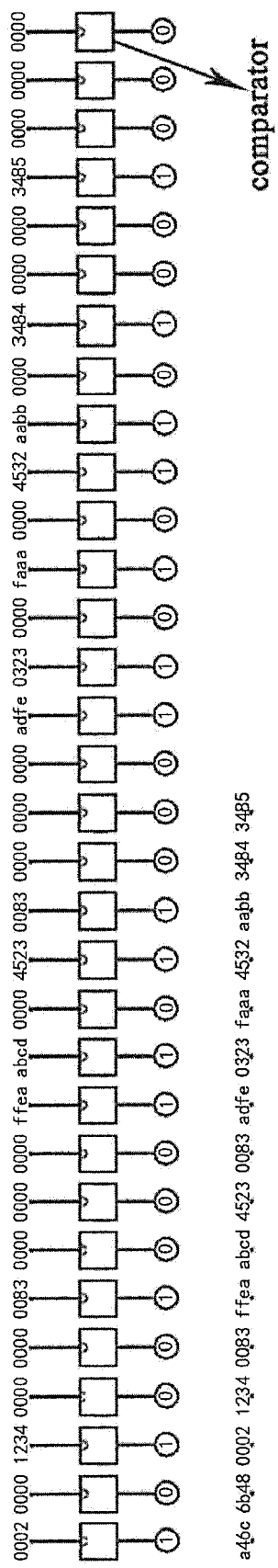
FIG. 4 is a structure diagram of a preferred second compression unit of the system according to the present invention.

Particularly, as shown in FIG. 4, the first compression unit 201a at least comprises 32 second comparators 4. The second comparator 4 is a 16-bit comparator. Therein, the second comparator 4 may be composed of 15 "OR gates". Preferably, the written-back data entered by the central processing unit 1 may have a size of 64B. The second compression unit 201b evenly divides the 64B written-back data into 32 sub-blocks. Each of the sub-blocks has a size of 2B. Where all the 2B sub-blocks are of "0", the output of the second comparator 4 is "0". Otherwise, the output of the second comparator 4 is "1". With 32 second comparators 4, 32 output results each expressed in "0" or "1" can be obtained. Each of the output results has a size of 1 bit, so when the size of the second register 6 is set as 4B, 32 output results can be stored.

In Step S4, the numbers N2 and M2 of "0" and "1" in the second register 6 are determined. The second register 6 is divided into sub-storage areas each having a size of 1B. Where N2 is greater than 2, and not all the last p first output results are "1", it is to be determined that the written-back data can be compressed using the second compression unit 201b and the second compression process is performed on the written-back data. Preferably, p=2, and since all the first output results are stored in the second register, the fact that not all the last p first output results are "1" may be understood as that not all the values in the Hth sub-storage area and the (H-1)th sub-storage area of the second register 6 are 1.

Particularly, the second compression process at least comprises the following steps: updating the first identifier of the addressing module 202 so as to indicate that the written-back data have been compressed, and reading and rotating the second identifier, and determining the means to storing data according to the rotated second identifier. Where a value of the second identifier after said rotation is 0, the data are compressed and stored according to the third storing means. Where the value of the second identifier after said rotation is 1, the data are compressed and stored according to the fourth storing means.

Preferably, third storing means refers to that the first sub-space, the second sub-space, the third sub-space and the fourth sub-space form the identifier storage area jointly. The first sub-space, the second sub-space, the third sub-space and the fourth sub-space are configured to having the n2 output results output by the first comparator written thereinto. The M2 sub-blocks that are in the second register 6 and have the value of 1 are written into the fifth sub-space . . . through he [2*(M2+2)]th sub-space of the memory space successively. Preferably, the size of the identifier storage area may be varied depending on the compression granularity. In the present invention, the first compression process performed by the first compression unit and the second compression process performed by the second compression unit are both determined according to the compression rates and the corresponding costs. For example, the first compression process works with compression granularity if Comp_z_32, and second compression process works with compression granularity of Comp_z_16. The identifier storage area is sized 4B, sufficient for compression granularity levels of Comp_z_8 and Comp_z_4. Since the two compression granularity levels are relatively large and lead to relatively small compression rates, their realization is less significant. Thus, the present invention poses no further limitation on the way to configuration for Comp_z_8 and Comp_z_4. Similarly, for Comp_z_64, the granularity is small and the costs are high, so its realization is also insignificant. The present invention therefore poses no further limitation on the way to configuration for Comp_z_64.

Preferably, the fourth storing means refers to that the last four sub-spaces of the memory space form the encoding identifier area jointly. In other words, the (a-3)th sub-space, the (a-2)th sub-space, the (a-1)th sub-space and the ath sub-space form the identifier storage area jointly. The n2 output results of the second comparator are written into the last four sub-spaces successively, which means the results are written according to the order of the (a-3)th sub-space, the (a-2)th sub-space, the (a-1)th sub-space, and the ath sub-space. Then the M2 sub-blocks that are in the second register 6 and have the value of 1 are written into the [2*(N2-2)+1]th sub-space . . . through the (a-4)th sub-space of the memory space successively.

Figure 5:
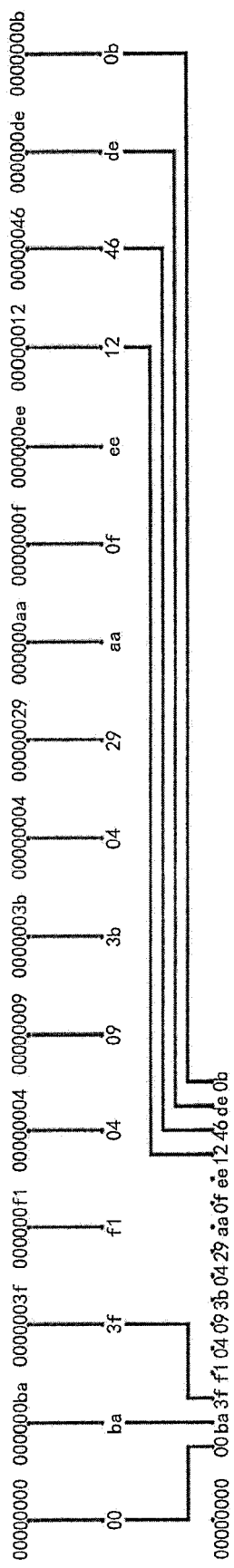
FIG. 5 is a structure diagram of a preferred third compression unit of the system according to the present invention.

In Step S5, where N2 is smaller than or equal to 2, or the p first output results are all "1", preferably, p=2, or in other words all the value in the Hth sub-storage area and the (H-1)th sub-storage area of the second register 6 are 1, the written-back data that are entered by the central processing unit 1 and have a size of m are now transmitted to the third compression unit 201c. The third compression unit 201c evenly divides the written-back data into n3 sub-blocks. Therein, the first sub-blocks are taken as radixes. The radixes are compared using exclusive OR operation. Bach of the sub-blocks is compared with the first sub-block through exclusive OR comparison so as to obtain n3 differences. As shown in FIG. 5, the difference refers to a difference that is zero after the prefix is removed. Where all the differences are 1B, it is determined that the written-in data can be compressed using the third compression unit 201c, and the third compression unit performs the third compression process on the written-in data. The difference is 1B means that the sub-block and the radix have the common first 3B, but their 4Bs are different. For example, as shown in FIG. 5, the written-back data are evenly divided into 16 sub-blocks. The first sub-block after processed is expressed by "00000000". The second sub-block after processed is expressed by "000000ba". The first sub-block and the second sub-block both have their first 3 Bs being "000000", and their 4th Bs are "00" and "ba", respectively, so the difference between the first sub-block and the second sub-block is 1B. In the foregoing process, by focusing on whether the extent of each is the last 1B but not the particular values, the condition for determination can be finally reduced to whether the first 3Bs are the same. When two sub-blocks have the same front 3B, it is determined that the difference therebetween in 1B. When all the 16 obtained differences are 1B, it is determined that the written-back data can be compressed. Then the third compression unit is used to perform the third compression process on the written-back data.

In Step S6, he third compression process at least comprises the following steps: updating the first identifier of the addressing module 202 so as to indicate that the written-back data have been compressed, reading and rotating the second identifier, and determining the data storing means according to rotated second identifier, which involves where the value of the second identifier after said rotation is 0, compressing and storing the data according to the fifth storing means, and wherein the value of the second identifier after said rotation is 1, compressing and storing the data according to the sixth storing means.

Particularly, the fifth storing means refers to that the first sub-space, the second sub-space, the third sub-space and the fourth sub-space form the identifier storage area jointly. Therein, the first sub-space, the second sub-space, the third sub-space and the fourth sub-space are all filled with "1". The radixes output by the third compression unit 201c are written into the fifth sub-space through the eighth sub-space successively, and all the differences are written into the ninth sub-space through the 24th sub-space successively. As shown in FIG. 6, all the identifier storage areas corresponding to the third compression process are filled with "1". Since it is impossible that all the identifier storage areas of the first compression process and the second compression process are "1", the foregoing means may act as the identifier of the compression algorithm for discriminating the third compression process from the first compression process and the second compression process.

Preferably, the sixth storing means refers to that the last four sub-spaces of the memory space form the encoding identifier area jointly. In other words, the (a-3)th sub-space, the (a-2)th sub-space, the (a-1)th sub-space and the ath sub-space form the identifier storage area jointly. All the identifier storage areas are filled with "1". The radixes output by the third compression unit 201c are written into the 41st sub-space through the 44th sub-space successively. All the differences are written into the 45th sub-space through the 60th sub-space successively.

In Step S7, where none of the differences has a size of 1B, the first identifier is updated to indicate that the written-in data cannot be compressed, and the written-in data are directly written into the NVM storage unit. For example, the first identifier may be updated to 0 so as to indicate that the written-in data cannot be compressed. At this point, the compression process for the written-in data is finished.

Embodiment 3

The present embodiment provides further improvements to the previous embodiment, and what is identical to its counterpart in the previous embodiment will not be repeated in the following description.

Figure 8:
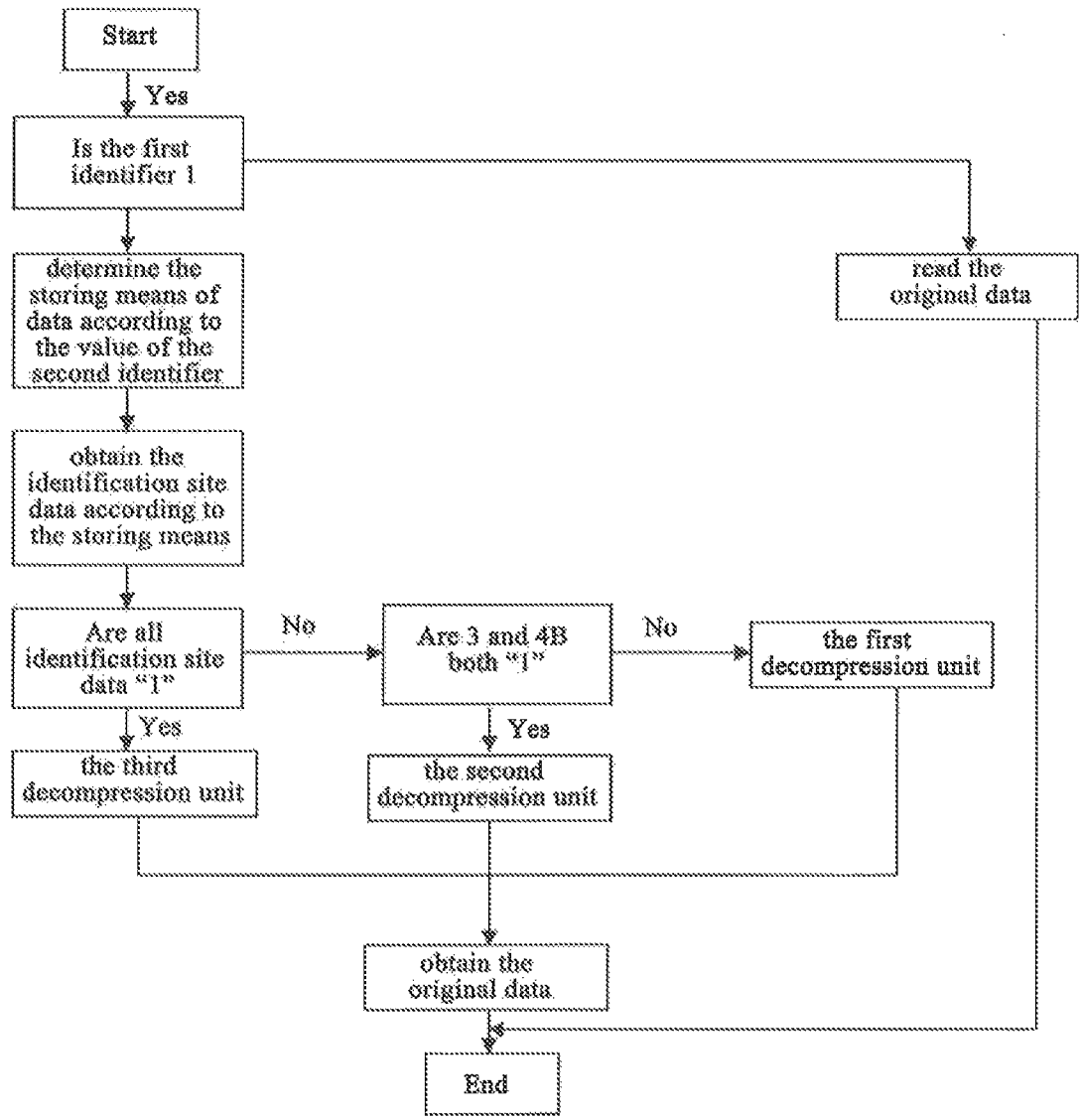
FIG. 8 is a flowchart of a preferred data decompression process according to the present invention.

The present invention further provides a data decompression method. As shown in FIG. 1 and FIG. 8, the data decompression module 203 at least comprises a first decompression unit 203a, a second decompression unit 203b and a third decompression unit 203c. The data decompression module 203 decompresses the data stored in the NVM storage unit 2 as described below.

In Step S1, the first identifier is read, and where the value of the first identifier is 0, the stored data are directly read to the cache of the central processing unit 1. Where the value of the first identifier is 1, the second identifier is read, and the identification site data of the identifier storage area are extracted.

Particularly, the value of the first identifier being 0 means that the stored data are not compressed, and thus can be directly read to the cache. On the contrary, where the value of the first identifier is 1, it means that the data have been compressed, and thus the second identifier has to be read so as to determine the storing means according to the identification site data. Where the value of the second identifier is 0, the identification site data on the 1B through the 4B are extracted. When the value of the second identifier is 1, the identification site data on the 61B through the 64B are extracted.

Particularly, the value of the first identifier being 0 means that the stored data are not compressed, and thus can be directly read to the cache. On the contrary, where the value of the first identifier is 1, it means that the data have been compressed, and thus the second identifier has to be read so as to determine the storing means according to the identification site data. Where the value of the second identifier is 0, the identification site data on the 1B through the 4B are extracted. When the value of the second identifier is 1, the identification site data on the 61B through the 64B are extracted.

In Step S2, where the value of the second identifier is 0 and all the identification site data are "1", the third decompression unit 203c is used to decompress the stored data. Therein, when all of the identification site data are not "1" and the last two bit sites are "1", the first decompression unit 203a is used to decompress the remaining part of the identification site data. Alternatively, where the last two bits of the identification site data are not "1", the second decompression unit 203b is used to decompress the data.

Particularly, all the identification site data being "1" indicates that the written-back data have been compressed using the third compression unit. Thus, the decompression process can be performed by the third decompression unit corresponding to the third compression unit. The last two bits of the identification site data being both "1" indicates that the written-back data have been compressed using the first compression unit. Thus, the decompression process can be performed on the compressed data by the first decompression unit corresponding to the first compression unit. Preferably, the bit sites contained in the first two bits of the identification site data are processed from the front to the back. Particularly, where the bit site is "0", "0" of the sub-block is output, and where the bit site is "1", the data in the sub-block are output successively, thereby obtaining original data sized 64B, for example. The remaining part of the identification site data refers to all the data other than the data of the last two bits. For example, where the identification site data have a size of 4B, the remaining part of the identification site data refers to the data of its first two bits.

Preferably, where the last two bits of the identification site data are not "1", it indicates that the written-back data have been compressed using the second compression unit. Thus, the decompression process can be performed by the second decompression unit corresponding to the second compression unit. Preferably, the bits in the identification site data are processed from the front to the back. Particularly, where the bit site is "0", "0" of the sub-block is output. Where the bit site is "1", the data of the sub-block are output successively, thereby obtaining the original data having a size of 64B, for example.

In Step S3, where the value of the second identifier is 1 and the identification site data are all "1", the data are decompressed using the third decompression unit. Therein, where none of the identification site data is "1" and the last two bits are both "1", the first decompression unit 203a is used to decompress the remaining part of the identification site data. Alternatively, where both of the last two bits of the identification site data are not "1", the data are decompressed using the second decompression unit 203b.

Particularly, where the identification site data are all "1", it indicates that the written-back data have been compressed using the third compression unit. Thus, the compressed data can be decompressed using the third decompression unit corresponding to the third compression unit. Where the last two bits of the identification site data are both "1", it indicates that the written-back data have been compressed using the first compression unit. Thus, the compressed data can be decompressed using the first decompression unit corresponding to the first compression unit. Preferably, the bit sites contained in the first two bits of the identification site data are processed from the front to the back. Particularly, where the bit site is "0", "0" of the sub-block is output, and where the bit site is "1", the data of the sub-block are output successively, thereby obtaining the original data having a size of 64B, for example. The remaining part of the identification site data refers to all the data other than the data of the last two bits. For example, where the identification site data have a size of 4B, the remaining part of the identification site data refers to the data of the front two bits.

Preferably, where the last two bits of the identification site data are not "1", it indicates that the written-back data have been compressed using the second compression unit. Thus, the decompression process can be performed using the second decompression unit corresponding to the second compression unit. Preferably, the bit sites in the identification site data are processed from the front to the back. Particularly, where the bit site is "0", "0" of the sub-block is output, and where the bit site is "1", the data of the sub-block are output successively, thereby obtaining the original data having a size of 64B, for example. The decompressed data are all read to the cache of the central processing unit, so as to finish reading of the data.

It should be noted that the above specific embodiments are exemplary, and those skilled in the art can come up with various solutions inspired by the disclosure of the present invention, and these solutions also fall into the scope of the present disclosure and fall into the present Within the scope of the invention. Those skilled in the art should understand that the description of the present invention and the accompanying drawings are illustrative and do not limit the claims. The scope of protection of the present invention is defined by the claims and their equivalents.

What is claimed is:

1. A hardware-supported 3D-stacked NVM data compression method for setting a first identifier to mark a compression state of written-back data, the method comprising the steps of:
dividing the written-back data into a plurality of sub-blocks and one of:
acquiring a plurality of first output results through OR operations among the sub-blocks, respectively; and
acquiring a plurality of second output results through exclusive OR operations among the sub-blocks determining a compression strategy for the written-back data based on the first output results or the second output results, wherein determining the compression strategy comprises:

dividing the written-back data into $n_1$ sub-blocks, wherein for each said sub-block entering one said first output result expressed in either "0" or "1" that is one of $n_1$ results obtained by performing the OR operation in an $h_1$-bit first comparator (3), respectively, and where a number $N_1$ of the first output results expressed in "0" is greater than 1, compressing the written-back data by performing a first compression process, in which where $N_1$ is smaller than or equal to 1, re-dividing the written-back data into $n_2$ sub-blocks, for each said sub-block entering one said first output result expressed in either "0" or "1" that is one of $n_2$ results obtained by performing the OR operation in an $h_2$-bit second comparator (4), respectively, and where a number $N_2$ of the first output results expressed in "0" is greater than 2 and the last p first output results are not all being "1", compressing the written-back data by performing a second compression process;

setting a second identifier to mark a storing means of the written-back data so that the second identifier is in pair with the first identifier; and configuring a storage strategy for the written-back data that includes at least rotating the second identifier, wherein configuring the storage strategy comprises:

configuring a memory space for the written-back data that at least comprises an identifier storage area, a compressed data storage area and an idle area according to a size of the written-back data, and dividing the memory space into sub-spaces each sized 1B; and where a value of the second identifier is expressed in 0 or 1, rotating the second identifier by exchanging the value of the second identifier, wherein:

where the value of the second identifier is 0, the identifier storage area is defined by the first b sub-spaces jointly, and where the value of the second identifier is 1, the identifier storage area is defined by the last b sub-spaces jointly.

2. The 3D-stacked NVM data compression method of claim 1, wherein the step of determining the compression strategy further comprises:

where $N_2$ is smaller than or equal to 2, or the p first output results are all being "1", re-dividing the written-back data into $n_3$ sub-blocks, performing exclusive OR operations in the first sub-block and between the first sub-block and the other sub-blocks, respectively, so as to acquire $n_3$ said second output results, and where the second output results are all being 1B, compressing the written-back data by performing a third compression process.

3. The 3D-stacked NVM data compression method of claim 2, wherein the first compression process further comprises the steps of:

updating the first identifier to indicate that the written-back data have been compressed, reading and rotating the second identifier, where the value of the second identifier after said rotation is 0, compressing and storing the data according to a first storing means, and where the value of a second identifier after said rotation is 1, compressing and storing the data according to the second storing means, wherein:

the first storing means refers to that the first sub-space, the second sub-space, the third sub-space and the fourth sub-space jointly form the identifier storage area, wherein the first sub-space and the second sub-space are configured to have the $n_1$ first output results written thereinto, and the third sub-space and the fourth sub-space are configured to have "1" written thereinto, and that $M_1$ said sub-blocks whose output results are "1" are written into the fifth sub-space, the sixth sub-space . . . through the $4*(M_1+1)^{th}$ sub-space of the memory space successively; and the second storing means refers to that the last four sub-spaces form the identifier storage area jointly, that the first two sub-spaces of the identifier storage area are configured to have the $n_1$ first output results written thereinto, that the last two sub-spaces of the identifier storage area are configured to have "1" written thereinto, and that $M_1$ said sub-blocks whose output results are "1" are written into the $[4*(N_1-1)+1]$th sub-space through the $(a-4)^{th}$ sub-space of the memory space.

4. The 3D-stacked NVM data compression method of claim 3, wherein the second compression process further comprising the steps of:

updating the first identifier to indicate that the written-back data have been compressed, and reading and rotating the second identifier, which involves where a value of the second identifier after said rotation is 0, compressing and storing the data according to a third storing means, and where a value of the second identifier after said rotation is 1, compressing and storing the data according to a fourth storing means, wherein:

the third storing means refers to that the first sub-space, the second sub-space, the third sub-space and the fourth sub-space form the identifier storage area jointly, in which the first sub-space, the second sub-space, the third sub-space and the fourth sub-space are configured to having the $n_2$ first output results written thereinto, and that $M_2$ said sub-blocks whose output results are "1" are written into the fifth sub-space through the $[2*(M_2+2)]^{th}$ sub-space of the memory space successively; and the fourth storing means refers to that the last four sub-spaces form the identifier storage area jointly, that the last four sub-spaces are configured to have the $n_2$ first output result written thereinto successively, and that $M_2$ sub-blocks whose output results are "1" are written into the $[2*(N_2-2)+1]^{th}$ sub-space through the $(a-4)^{th}$ sub-space of the memory space successively.

5. The 3D-stacked NVM data compression method of claim 4, wherein the third compression process further comprising the steps of:

updating the first identifier to indicate that the written-back data have been compressed, and reading and rotating the second identifier, which involves where a value of the second identifier after said rotation is 0, compressing and storing the data according to a fifth storing means, and where a value of the second identifier after said rotation is 1, compressing and storing the data according to a sixth storing means, wherein:

the fifth storing means refers to that the first sub-space, the second sub-space, the third sub-space and the fourth sub-space form the identifier storage area jointly, in which the first sub-space, the second sub-space, the third sub-space and the fourth sub-space all have "1" written thereinto, that the first sub-blocks are written into the fifth sub-space through the $8^{th}$ sub-space successively, and that the $n_3$ second output results are written into the $9^{th}$ sub-space through the $24^{th}$ sub-space successively;

the sixth storing means refers to that the last four subspaces of the memory space form the encoding identifier area jointly, in which all the spaces of the identifier storage area have "1" written thereinto, that the first sub-blocks are written into the 41$^{st}$ sub-space through the 44$^{th}$ sub-space successively, and that the $n_3$ second output results are written into the 45$^{th}$ sub-space through the 60$^{th}$ sub-space successively.

6. A hardware-supported 3D-stacked NVM data compression system, comprising:

a central processing unit; and a 3D-stacked NVM, the 3D-stacked NVM being configured to compress written-back data of the central processing unit according to steps of:

dividing the written-back data into a plurality of sub-blocks and acquiring a plurality of first output results through OR operations among the sub-blocks, respectively, or acquiring a plurality of second output results through exclusive OR operations among the sub-blocks, and determining a compression strategy for the written-back data based on the first output results or the second output results; and setting a second identifier to mark a storing means of the written-back data so that the second identifier is in pair with the first identifier, and configuring a storage strategy for the written-back data that includes at least rotating the second identifier; and the 3D-stacked NVM at least comprises a data compression module for compressing the written-back data, an addressing module for rotation and a data decompression module for decompressing data;

wherein the data compression module is configured to:

divide the written-back data into $n_1$ sub-blocks, wherein for each said sub-block enter one said first output result expressed in either "0" or "1" that is one of $n_1$ results obtained by performing the OR operation in an $h_1$-bit first comparator), respectively, where a number $N_1$ of the first output results expressed in "0" is greater than 1, compress the written-back data by performing a first compression process, where $N_1$ is smaller than or equal to 1, re-divide the written-back data into $n_2$ sub-blocks, for each said sub-block enter one said first output result expressed in either "0" or "1" that is one of $n_2$ results obtained by performing the OR operation in an $h_2$-bit second comparator, respectively, and where a number $N_2$ of the first output results expressed in "0" is greater than 2 and the last p first output results are not all being "1", compress the written-back data by performing a second compression process.

7. The 3D-stacked NVM data compression system of claim 6, wherein the data decompression module at least comprises a first decompression unit, a second decompression unit and a third decompression unit, in which the data decompression module decompresses the data by:

reading the first identifier, where a value of the first identifier is 0, reading the data directly, and where the value of the first identifier is 1, reading the second identifier, and extracting identification sites from the identifier storage area;

where a value of the second identifier is 0 and all the identification site data are "1", decompressing the data using the third decompression unit, which involves where none of the identification site data is "1" and the last two bit data are both "1", decompressing the remaining part of the identification site data using the first decompression unit; or, where none of the last two identification sites is "1", decompressing the data using the second decompression unit; and where the value of the second identifier is 1 and all the identification site data are "1", decompressing the data using the third decompression unit, which involves where none of the identification site data is "1" and all of the last two bits are "1", decompressing the remaining part of the identification site data using the first decompression unit; or, where none of the last two bits is "1", decompressing the data using the second decompression unit.

\* \* \* \* \*